United States Patent [19]
Ikeya et al.

[11] Patent Number: 5,658,153
[45] Date of Patent: Aug. 19, 1997

[54] SOCKET APPARATUS

[75] Inventors: Kiyokazu Ikeya, Shizuoka-ken, Japan; Masahiro Fuchigami, Mansfield, Mass.; Kunio Kobayashi, Ikeda; Hidekazu Iwasaki, Sanda, both of Japan

[73] Assignee: Texas Instruments Incorporated, Dallas, Tex.

[21] Appl. No.: 536,540

[22] Filed: Sep. 29, 1995

[30] Foreign Application Priority Data

Oct. 4, 1994 [JP] Japan ................. 6-264695

[51] Int. Cl.$^6$ .................................. H01R 9/09
[52] U.S. Cl. ............................................. 439/72
[58] Field of Search ................. 439/72, 73, 331, 439/266, 330

[56] References Cited

U.S. PATENT DOCUMENTS 5,395,255  3/1995  Kato ........................... 439/72

*Primary Examiner*—Neil Abrams
*Assistant Examiner*—Eugene G. Byrd
*Attorney, Agent, or Firm*—Russell E. Baumann; Richard L. Donaldson; Rene' E. Grossman

[57] ABSTRACT

A socket has a base (10) that is to be fixed on a printed wiring substrate (not shown in the drawings) and a cover (12), in the shape of a square frame, that is reciprocably movable in the vertical direction relative to base (10). An adaptor (20) is fixed to the center of base (10) by means of bolts (22) and an elevator carrier (24) is mounted on adaptor (20) in such a manner as to move among first, second and third vertically disposed positions in dependence upon movement of the cover (12). A large number of contact elements (26) are arranged in a pattern corresponding to the lead terminal pattern of an IC package for loading in the socket. Above each contact row, there is provided a linkage mechanism (32, 36) including a laterally extending bar (36a) movable toward and away from contact elements (26) in dependence upon the vertical movement of the cover (12).

8 Claims, 6 Drawing Sheets

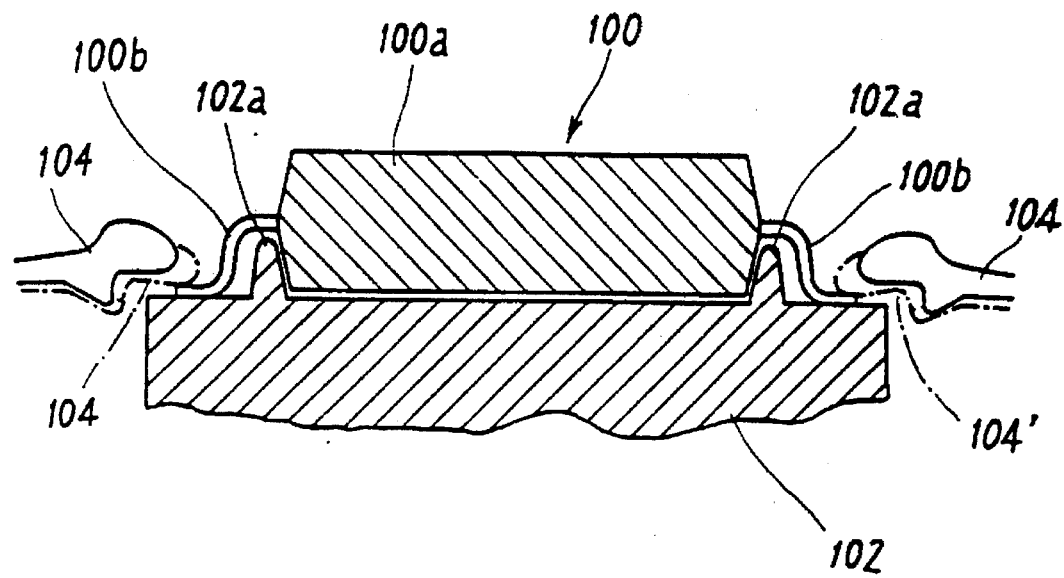
PRIOR ART  FIG. 11
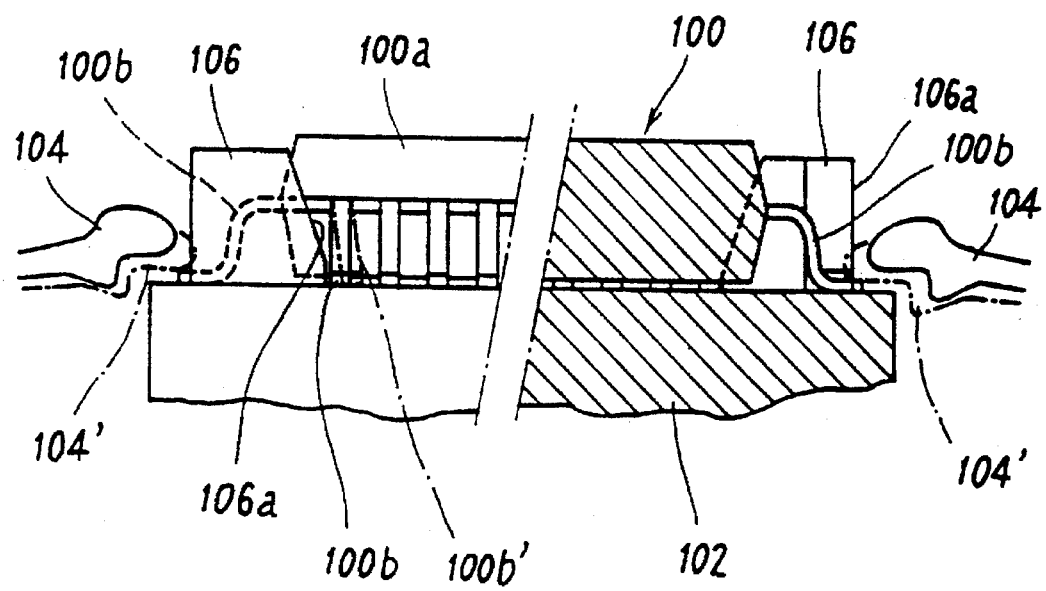
PRIOR ART  FIG. 12

SOCKET APPARATUS

FIELD OF THE INVENTION

This invention relates to a socket for removably loading an electric part having a large number of terminal leads in order to effect electrical connection with each terminal lead.

BACKGROUND OF THE INVENTION

It is generally the case at semiconductor manufacturing plants that an IC package comprising a plastic encapsulated semiconductor integrated circuit chip (which will hereafter be referred to as an IC chip) is subjected to an electrical property test and a reliability test called a burn-in test prior to its shipment in order to separate good from bad product. The electrical property test is carried out for the purpose of inspecting the input-output characteristics, pulse characteristics, noise leeway, and the like of the IC chips. In the burn-in test, the IC packages which pass the electrical property test are placed in an oven and operated for a certain period of time under an electric voltage source which is larger than the rated value by approximately 20 percent at a high temperature, 120 degrees centigrade, for example. The IC packages which perform unsatisfactorily in the burn-in test are discarded as being unsatisfactory and only the IC packages which continue to perform normally are shipped out as satisfactory products.

The IC package is generally subjected to the burn-in test loaded in a socket. Such sockets are installed on a printed wiring substrate and, with a large number of contacts provided in the socket engaging the leads of the IC in a 1:1 relationship, the IC package is electrically connected to a test device through the printed wiring substrate. Accordingly, the IC package must be accurately positioned inside the socket so that each contact element will accurately engage the corresponding lead.

FIGS. 11 and 12 show typical prior art structure for positioning an IC package in a socket. According to the structure shown in FIG. 11, an IC package 100 is loaded in the socket on base 102 and either the side or the corner part of package 100a is positioned by a rib 102a provided on base 102. A large number of contacts 104 are arranged around base 102 at a pitch corresponding to the leads 100b of IC package 100 and contact elements 104 are elastically displaced as shown by the dashed line 104' by the force coming from a compressive driving means that is not shown in the drawings, thereby making contact under added force with the tip part of leads 100b.

With regard to FIG. 12, guide post 106 having a tapered surface 106a is disposed at a prescribed location on the base 102 so that when the IC package 100 is placed on base 102 leads 100b at the end of each row of leads are guided and positioned by tapered surface 106a.

If there is an error in the relative positional relationship between package 100a and leads 100b in the IC package 100, according to the positioning method as described relative to FIG. 11, there is a danger of leads 100b being misaligned with contacts 104 even if the package 100a is properly positioned on the base 102.

Also, with regard to FIG. 12, if the lead 100b at the end of a lead row hits the tapered surface 106a of guide post 106 while being held by a carrier, it can be bent as shown by the dashed line 100b', with a result that there is a possibility not only for this lead but also the lead row as a whole to be moved out of position on the base 102. That is, when an IC package 100 is loaded in the burn-in socket, typically a carrier arm of an automatic unit or the like carries the IC package 100 over to the top of base 102. If the loading position of the carrier arm deviates even a slight amount in this connection, lead 100b at the end severely impacts the tapered surface 106a of the guide post 106 thereby bending the lead.

As the pitch between the leads of the IC package become narrower and as the leads become thinner along with improvements of the integration density of the IC chip, the shortcomings of the conventional positioning methods as described above become all the more pronounced.

SUMMARY OF THE INVENTION

An object of the present invention is to provide a socket which is capable of safely and accurately positioning and loading an electric part such as an IC package.

In accordance with a preferred embodiment of the invention, a socket comprises a main socket body for removably mounting a selected electric part having a package that accommodates an electric circuit and a plurality of terminal leads that extend in a given pattern from the sides of the package. A plurality of contact elements are provided at selected locations in the main socket body so that each can be electrically connected with a respective terminal lead of the electric part in a 1:1 relationship. A vertically movable elevator carrier is disposed in the main socket body which, in connection with the loading of the electric part in the socket, lowers the electric part after the electric part is loaded at a first position to a second position for connection of the terminal leads of the electric part with the contact elements, followed by the separation of the elevator carrier from the electric part as it is lowered to a third position.

According to a feature of the invention, a package positioning means that positions the package of the electric part is provided on the elevator carrier. According to another feature of the invention, a terminal lead guiding means for positioning the terminal leads of the electric part in connection with the elevator carrier's lowering of the electric part from the first position to the second position is provided in the main socket body. The electric part descends substantially of its own weight so that it guided and positioned without causing any damage to the terminal leads.

According to yet another feature of the invention, a compressive bar means that acts in linkage with and in dependence upon the vertical movement of the elevator carrier is provided in the main socket body. The terminal leads of the electric part ride on top of respective contact elements at the second position and the compressive bar means then move into engagement with the top surface of the terminal leads with a result that the contact elements engage terminal leads of the electric part with added force, while being elastically deformed.

According to the invention, the elevator carrier carrying an electric part descends and separates from the electric part at a prescribed location of its stroke. The terminal leads of the electric part continue to ride on the respective contact elements at the prescribed location and, as a compressive bar means engage the terminal leads from above, the contact elements are elastically deformed adding to the force of engagement with the terminal leads under added force.

BRIEF DESCRIPTION OF THE DRAWINGS

FIG. 11 is a partial side view in cross section shown for the purpose of explaining an IC package positioning method according to the prior art; and FIG. 12 is a side view partially in cross section shown for the purpose of explaining another IC package positioning method according to the prior art.

DETAILED DESCRIPTION OF PREFERRED EMBODIMENT

Figure 1:
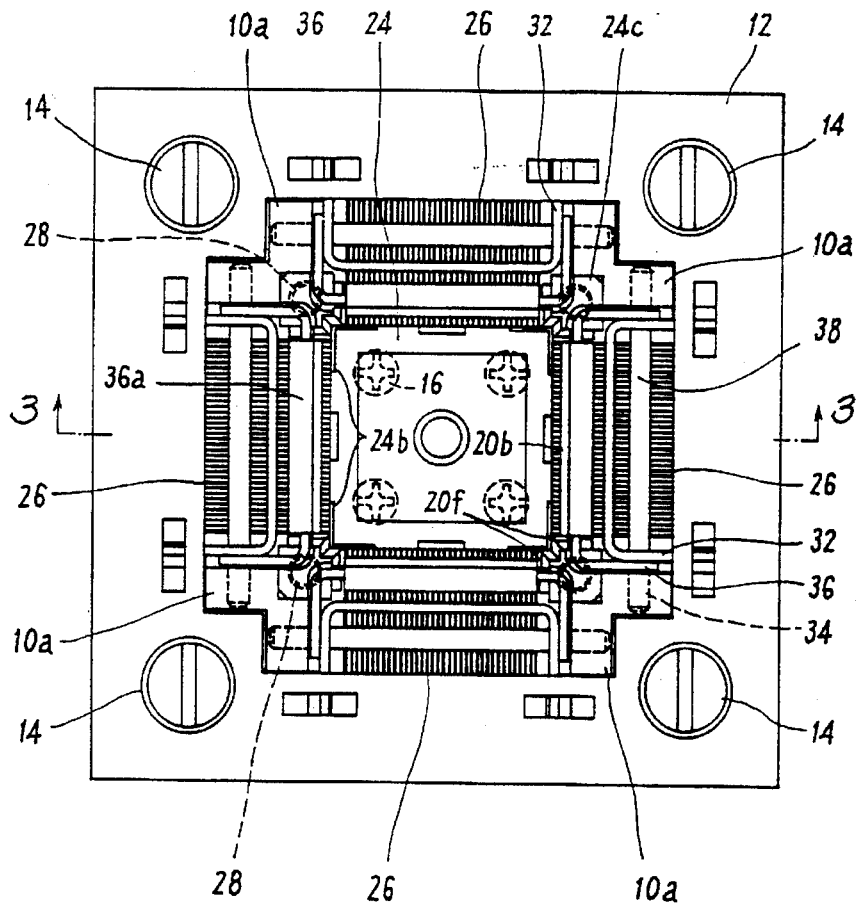
FIG. 1 is a plan view showing the construction of a burn-in socket made in accordance with the invention at a time when the cover is at its original at-rest position.
Figure 2:
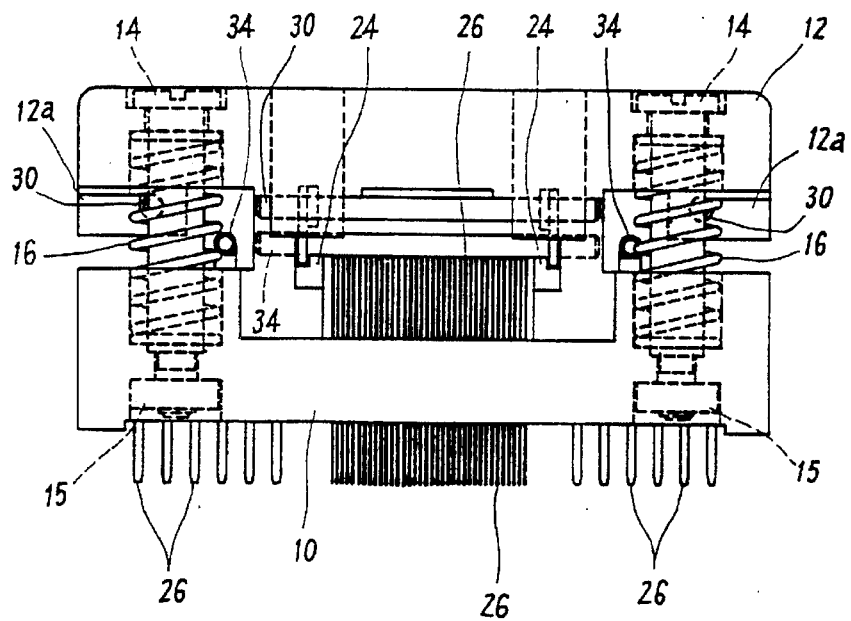
FIG. 2 is a side view of the FIG. 1 socket which is in the same state as shown in FIG. 1.

The burn-in socket apparatus according to a preferred embodiment of the invention will be explained below by reference to FIGS. 1 through 10.

With particular reference to FIGS. 1–5, the socket apparatus, comprises a base 10 as the main socket body that is fixed to a wiring substrate (not shown in the drawings) and a cover 12 generally in the shape of a square frame adapted for alternating motion in the vertical direction relative to base 10. Cover 12 is mounted to base 10 by means of a bolt 14 and a nut 15 located adjacent each corner of cover 12, with a compression coil spring 16 freely mounted about each bolt 14. Compression coil springs 16 provide an upward force to cover 12 with the heads of bolts 14 serving as a stop so that the cover 12 will not become disengaged. In addition, cover 12 is so arranged that it can be pressed down to the top surface of base 10 in opposition to compression coil springs 16. A post 10a is provided on the base inside each of the four corners of cover 12 for guiding the cover in its vertical movement.

The socket described in the present embodiment is adapted to receive an IC package 40 of the QFP (Quad-in-line Flat Package) type in the upper portion of base 10. An adaptor 20 is fixed to the center of base 10 by means of bolts 22 and, above adaptor 20, an elevator carrier 24 is mounted for vertical, reciprocal motion. A large number of contact elements 26 are arranged around adaptor 20 in a pattern corresponding to the four-side terminal lead pattern of IC packages of the QFP type.

Each contact element 26, formed by stamping from a thin sheet of beryllium copper, by way of example, comprises a stationary portion 26a that is fixed to base 10, an arc spring portion 26b which extends along a curved line upwardly from the center of stationary portion 26a, a straight line spring portion 26c which extends obliquely upwardly from the upper edge of arc spring portion 26b toward the center of base 10, a hook-shaped contact portion 26d that has been formed at the tip of this straight-line spring portion 26c and contact pins 26e that extend perpendicularly downwardly through the base 10 from two locations in the stationary portion 26a.

Partition walls 20b are provided at the top part of a sidewall 20a of adaptor 20 at a pitch corresponding to the contact elements for preventing engagement of any contact element 26 with its neighboring contact element 26 by guiding contact portion 26d of each contact element 26. With respect to adaptor 20, a stop platform 20c formed inside sidewall 20a, functions as a lower stop for elevator carrier 24. Leg 24a of elevator carrier 24 is freely inserted into a groove 20d between stop platform 20c and sidewall 20a of the adaptor. Adaptor 20 is also provided with corner posts 20f each having a tapered surface 20e at positions close to both ends of each row of contact elements 26.

Elevator carrier 24, a generally square body, has an upper surface which functions as a carrier for placement of the IC package. A rib 24b for positioning of the IC package is disposed at each of the four corners on the upper surface of elevator carrier 24. Moreover, motion transfer block 24c extends out in a lateral direction from each of the four corners of the elevator stand 24.

Figure 5:
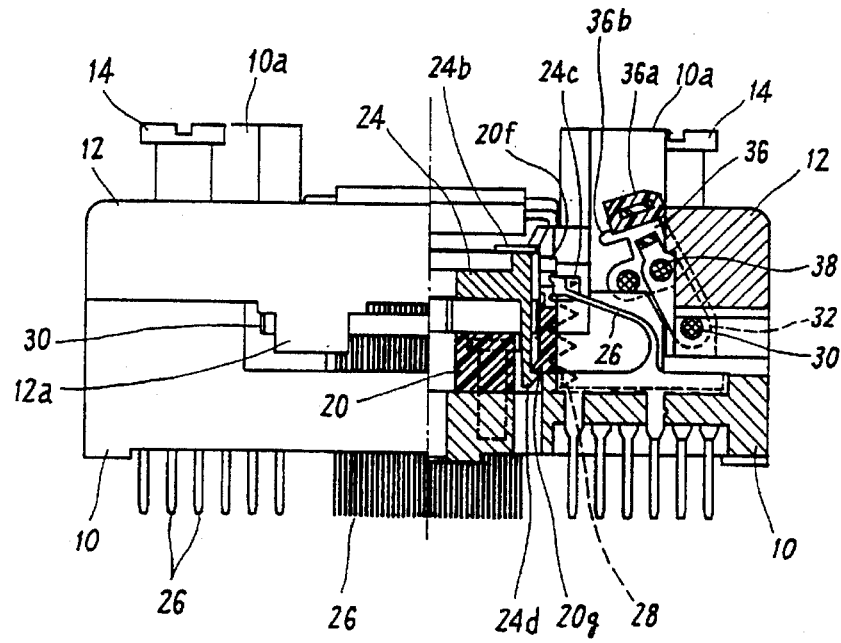
FIG. 5 is a front elevation and cross section taken along line 5—5 in FIG. 4.

A respective vertically oriented compression coil spring 28 has a lower end fixed to the base 10 and an upper end either engaged or linked with motion transfer block 24c. Compression coil springs 28 provide an upward bias to elevator carrier 24. As shown in FIG. 5, however, a hook 24d formed at the distal bottom portion of leg 24a of elevator carrier 24 is engageable with a stop projection 20g formed on the inner portion of sidewall 20a of adaptor 20 so that elevator carrier 24 will not become disengaged.

A link mechanism is disposed above each contact element row for operating the contact elements 26 in linkage with the vertical movement of cover 12 as will be described below.

The facing legs of a U-shaped rotary member 32 are rotatably mounted on a shaft 30 fixed between a pair of spaced support wall members 12a that extend downwardly from cover 12 on the lower surface of each frame side. The facing L-shaped legs of U-shaped rotary member 36 are rotatably mounted on a shaft 34 fixed between adjoining posts 10a of base 10 disposed inside the angular part of cover 12. The legs of the U-shaped rotary members 32 and 36 are linked together by means of a shaft 38. The legs or rotary member 36 are generally L-shaped with the base of the L connected at one end to shaft 34 and at the other end to shaft 38. The outer end of the bright portion of the L is connected to the central (bight) part 36a of U-shaped rotary member 36. Part 36a is covered by electrically insulative material such as plastic, to cite an example, forming a laterally extending bar disposed over each row of contact elements. An inwardly-facing, downwardly projecting finger 36b is formed at the base of both legs of the U-shaped rotary member 36 for a purpose to be described below.

Figure 3:
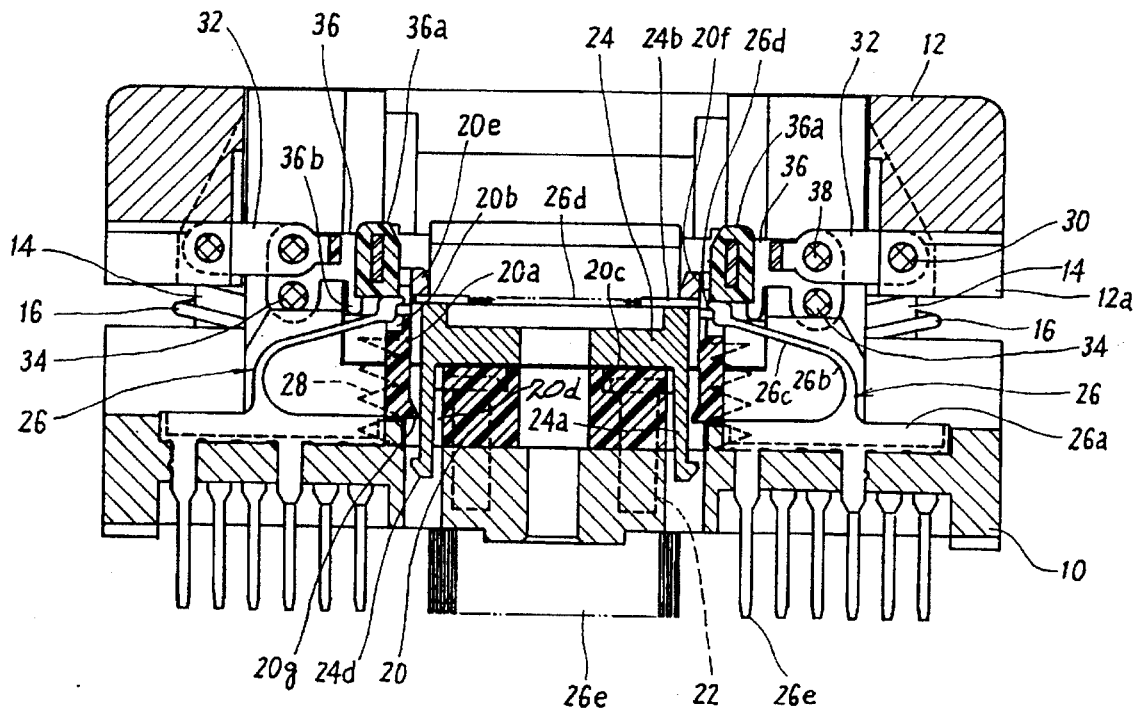
FIG. 3 is a cross section taken along line 3—3 in FIG. 1.
Figure 4:
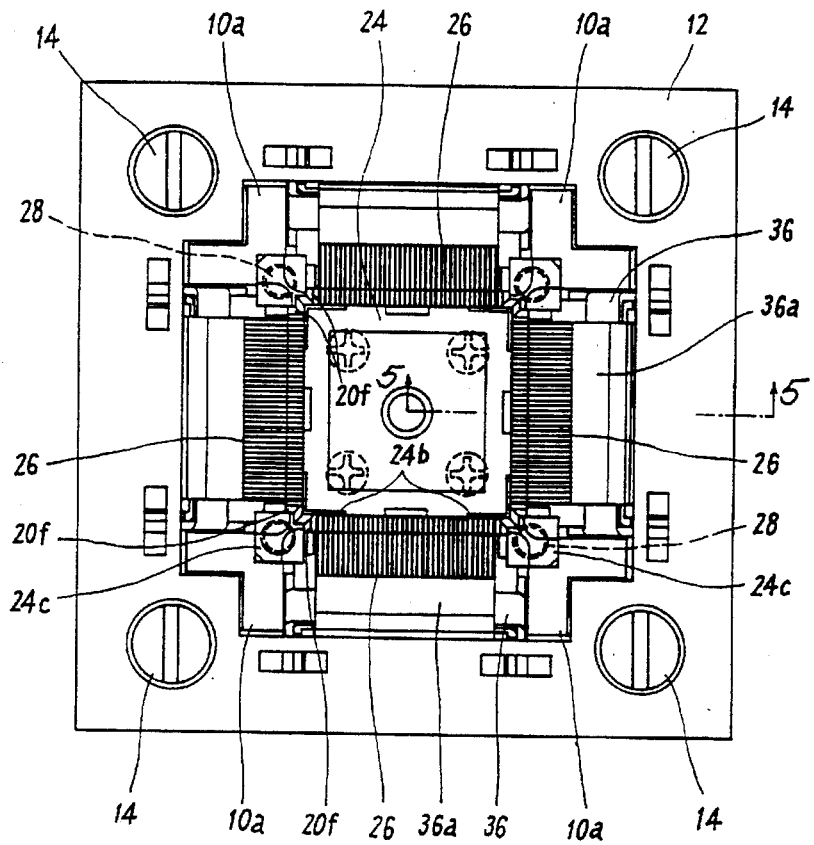
FIG. 4 is a plan view of the FIG. 1 socket with the cover lowered but shown without an IC package.

In operation, shaft 30 moves down along with cover 12 as a result of lowering of the cover from the position shown in FIG. 3 down to base 10. With this movement, shaft 38 pivots around the fixed shaft 34 (with shaft 38 shown at the right side of FIG. 3 moving clockwise and shaft 38 shown at the left moving counter-clockwise) via the rotary members 32 and 36 and the insulated laterally extending bar 36a of the rotary member 36 also revolves in the same direction as is shown in FIG. 5. As a result, bar 36a moves obliquely away from the contact portions 26d of contact elements 26.

When cover 12 rises from the position shown in FIG. 5 separating from base 10, the reverse action takes place. In other words, as shaft 30 rises integrally with cover 12, shaft 38 revolves around fixed shaft 34 as the center (shaft 38 on the right side of FIG. 5 moving in the counter-clockwise direction), via the rotary members 32 and 36 and the insulated laterally extending bar 36a of the rotary member 36 also revolves in the same direction.

When cover 12 rises to such a height where it is stopped by the heads of bolts 14, the insulated laterally extending bar 36a of the rotary member 36 engages the contact portions 26d of a row of contact elements 26. As will be described later, the elevator carrier 24 is made to ascend or descend in dependence upon the action of this linkage mechanism.

Figure 6:
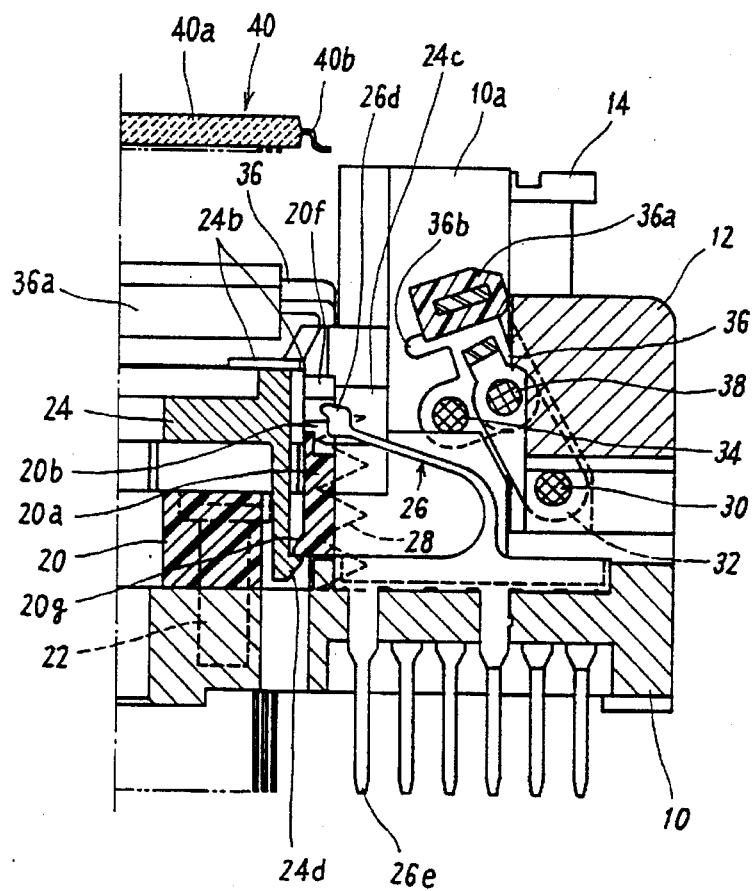
FIG. 6 is a cross section of a portion of a socket prior to the loading of the IC package in the socket described in the embodiment.

Next, the action involved in connection with the loading of an IC package in the socket will be explained by referring to FIGS. 6 through 9. As shown in FIG. 6, cover 12 is pressed down to base 10 for the purpose of inserting IC package 40. Upon lowering of the cover, the insulated laterally extending bar 36a of the rotary member 36 of the linkage mechanism recedes to a position which is obliquely behind the contact portions 26d of contact elements 26 and the elevator carrier 24 rises by the spring force of the compression coil springs 28 to a position where the hook portion 24d at the bottom of leg 24a is stopped by the stop projection 20g of adaptor 20.

IC package 40 of the QFP type has a selected number of gull-wing type terminal leads 40b which extend outwardly from the walls of the four sides of the thin rectangular package 40a. The pattern of contact elements 26 is chosen to correspond to the terminal lead pattern of IC package 40.

Figure 7:
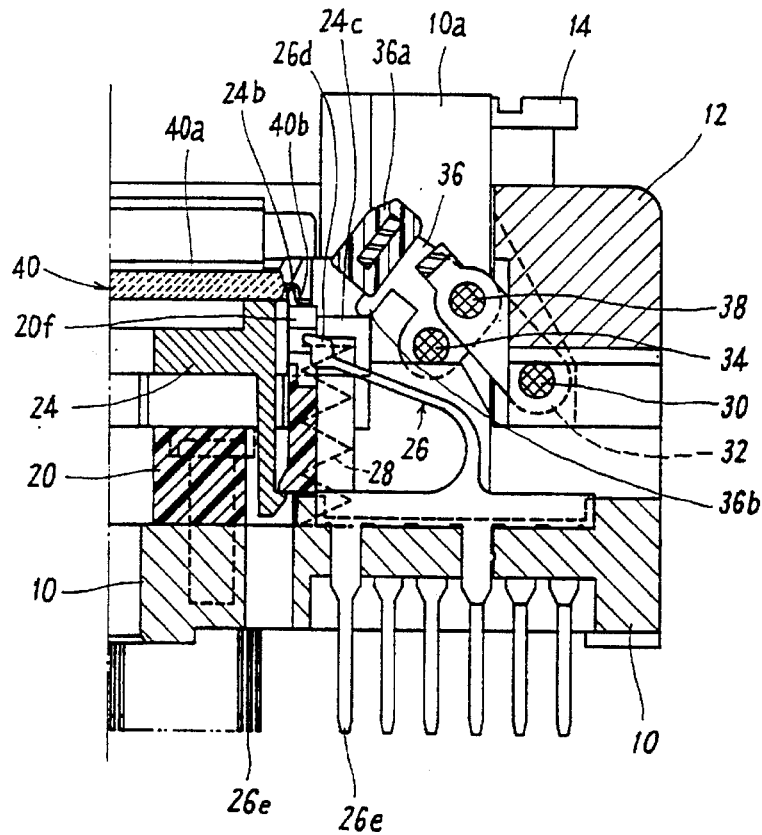
FIG. 7 is a cross section similar to FIG. 6 showing the socket when the elevator carrier with an IC package loaded thereon starts descending in the socket.
Figure 8:
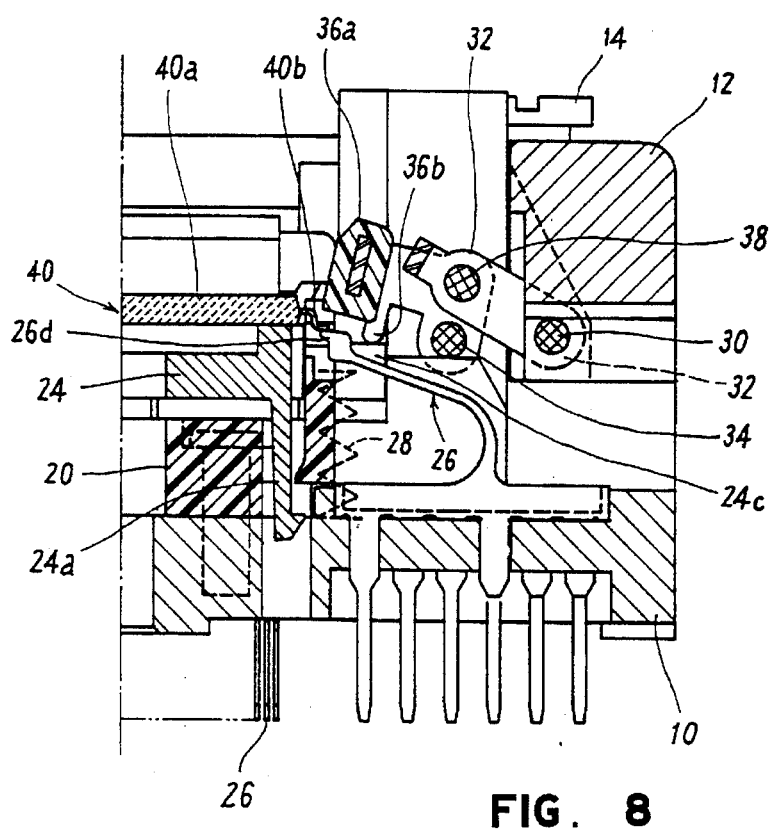
FIG. 8 is a cross section similar to FIGS. 6 and 7 showing the socket when the terminal leads of the IC package have come into engagement with the contact elements in the socket.

IC package 40 is carried to the socket by means of a carrier arm (not shown in the drawings), for example, and is placed on top of the elevator carrier 24 via an opening of the cover 12 as shown for example in FIG. 7. In this connection, package 40a of IC package 40 is guided laterally at each of its four corners by means of rib 24b of elevator carrier 24 in order to position the package on the elevator carrier 24. In this position the terminal leads 40b of the IC package 40 extend freely beyond the elevator carrier 24 out of engagement with any object.

After IC package 40 has been placed on elevator carrier 24 as described above, cover 12 gradually ascends. As cover 12 rises it separates from base 10 by the spring force of compression coil springs 16 and, along with the ascendance of cover 12, the linkage mechanism pivots in a counter-clockwise direction (as seen in FIG. 7) and the finger portion 36b of the rotary member 36 rides on top of motion transfer block 24c of elevator carrier 24 as shown in FIG. 7. As cover 12 further rises because of the spring force of compression coil springs 16, rotary member 36 of the linkage mechanism rotates in a counter-clockwise direction and finger portion 36b presses down motion transfer block 24c in opposition to the spring force of compression springs 28, thereby lowering elevator carrier 24. Thereupon, IC package 40, placed on the elevator stand 24, is lowered along with the elevator carrier 24. In connection with this lowering, the terminal lead 40b at the end of each lead row of the IC package is guided by the respective corner post 20f of adaptor 20. In view of the fact that the IC package 40 comes down substantially by its own weight, the counter force that is received from the corner post 20f is extremely small so that there is no bending of a terminal lead 40b at the end which slides against it.

As the lead 40b at the end of each lead row is safely guided without being bent as described above, the lead row as a whole is safely and accurately guided, with each lead 40b being positioned in the groove between the mutually adjacent partition walls 20b of adaptor 24, where it rests on the contact part 26d of each contact 26. When cover 12 further rises by the spring force of compression coil springs 16 after each lead 40b of IC package 40 rides on the contact part 26d of a respective contact element 26, elevator carrier 24 descends further in dependence upon the revolving action of the linkage mechanism and separates from IC package 40 so that IC package 40 is supported only by contact elements 26. Immediately thereafter, the insulated laterally extending bar 36a of the rotary member 36 engages the top surface of each terminal lead in a row in such a fashion as to sandwich terminal leads 40b of IC package 40 with contact portions 26d. Thereafter, the three members (36a, 40b and 26d) as a single unit, are slightly displaced in the counter-clockwise direction in opposition to the spring force of the spring portions 26b and 26c of the contact element 26.

Figure 9:
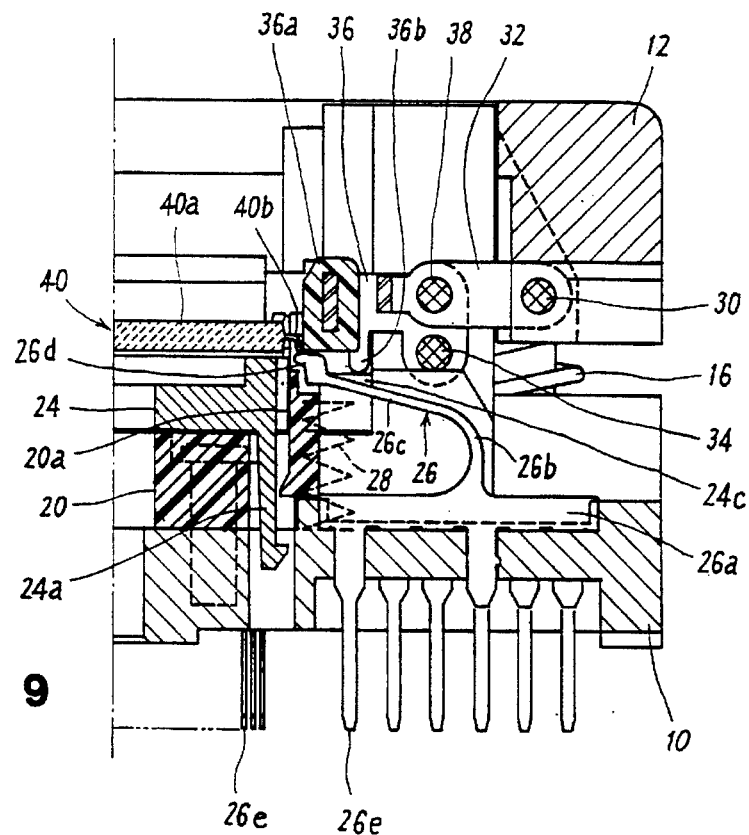
FIG. 9 is a cross section similar to FIGS. 6-8 showing the socket when the loading of the IC package in the socket has been completed.

As a result of the above, when the cover 12 rises to a position (the original at-rest position) where its motion is stopped by the head of bolts 14 as shown in FIG. 9, each contact element 26 is elastically displaced as if it were taking a bow due to the compressive force from the insulated laterally extending bar 36a of the rotary member 36, thereby obtaining a satisfactory electric engagement under a prescribed force between each contact element 26 and a respective terminal lead 40b.

When the cover is at its at-rest position, the elevator carrier 24 has descended to a position which is lower than the IC package, such as the position where it is in engagement with the upper surface of adaptor 20 due to the motion transferred from finger portion 36b of the rotary member 36. Accordingly, there is no possibility for the elastic displacement of the contact elements 26 or the added force of engagement with the terminal lead 40b to be obstructed by the elevator carrier 24.

Figure 10:
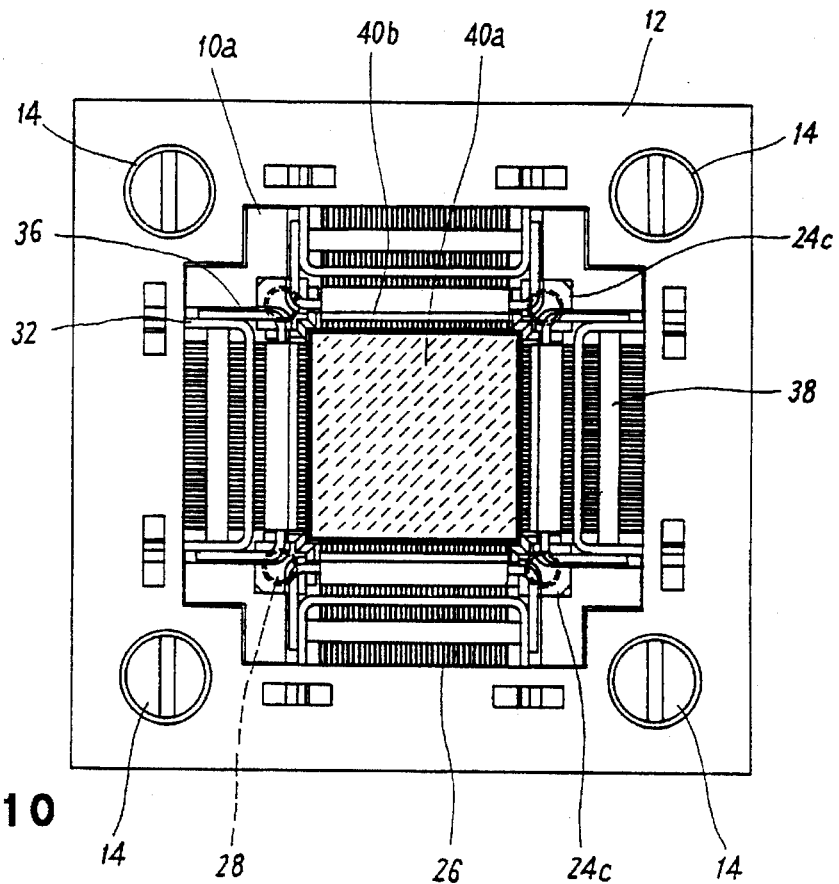
FIG. 10 is a plan figure showing the socket when the loading of the IC package in the socket has been completed as shown in FIG. 9.

FIG. 10 is a plan view showing the state in which the IC package 40 is loaded in the socket (the state shown in FIG. 9). The action regarding FIGS. 6 through 9 is carried out simultaneously at each of the four corners of IC package 40 and all terminal leads 40b of the IC package 40 are electrically connected in a 1:1 relationship with respectively corresponding contact elements 26. In this loaded state, the IC package 40 is subjected to a burn-in test.

For the extraction of IC package 40, it is only necessary to press down cover 12 from the position shown in FIG. 9 to the base 10. Thereupon, the linkage mechanism (shown in FIGS. 6 through 9) rotates in the clockwise direction in dependence upon downward movement of cover 12 and the insulated laterally extending bar 36a of the rotary member 36 recedes obliquely away from contact elements 26, with each part inside the socket returning to the state shown in FIG. 6. The IC package is then removed by means of a pair of tweezers, suction means or the like.

A preferred embodiment has been described above. It is mentioned in this connection that this invention is not to be restricted to the embodiment that has been described. It can, instead, be modified in various ways within the range of its technical concept. For example, the overall shape of contact element 26 or the shape of each contact part can be modified freely and various materials can be used. The shape and material of base 10 or the installation position and the arrangement of contact elements 26 in the base can be changed. Moreover, the shape of cover 12 and the structure and shape of the opening and closing mechanism and the linkage mechanism can also be changed in a variety of ways.

Adaptor 20 can be suitably modified in conformity with the shape, etc., of the contact elements 26 and the position and the number, etc., of the corner posts 20f can be suitably changed. In addition, adaptor 20 can be made integral with the base. The structure of the elevator carrier 24 and the shape and position, etc., of the rib 24b can also be suitably modified.

In the above-described example, for example, the terminal leads of the IC package are placed on the contact portion 26d of the contact elements 26 because of the lowering of the elevator carrier and, as the insulated laterally extending bar 36a of the rotary member 36 of the link mechanism is placed thereon, the contact elements 26 are made to engage the terminal leads 40b of IC package 40 under added force while being elastically deformed. However, it can be so constructed that the terminal leads 40b of the IC package may be placed on a prescribed support (such support corresponding to the adaptor 20) due to the lowering of the elevator carrier 24, with the contact elements being displaced and caused to engage the terminal leads 40b due to the compressive force from the linkage mechanism, etc., with a result that the contact elements provide an added contact force with the leads 40b of IC package 40b while being elastically deformed.

In the described embodiment, the terminal leads 40b of IC package 40 are guided and positioned by the corner posts 20f of the adaptor 20. In the case of an IC package having terminal leads whose width are such as to absorb or permit positional aberrations of the leads by the positioning of the package in the elevator carrier 24 it is possible to eliminate the corner posts 20f as described above or the corresponding positioning means.

Moreover, this invention can be used for sockets other than the burn-in test socket such as sockets for the electric property test on the input-out characteristics, pulse properties, noise leeways, etc., of the IC chips.

The electric part used in the described embodiment is an IC package having terminal leads that extend from the package in four directions. It will be understood that the invention can be used with other types of IC packages such as the two directional flat package or one directional flat package (SIP), etc.

Regarding the shape of the leads of the IC package, further, not only gull wing shape but also other shapes such as the straight line type, etc., can be used. It can also be used for electrical parts other than an IC package.

According to the invention which has been described above, the electric part can be stably loaded as the electric part is being lowered on an elevator carrier, while each terminal lead is made to engage a corresponding contact element in connection with the loading of the electric part in the main socket body. Further, means for positioning the package of the electric part is provided on the elevator carrier and terminal lead guiding means for the guidance and positioning of the terminal leads of the electric part in connection with the lowering of the electric part by the elevator carrier from the first position to the second position is provided at a prescribed location inside the main socket body with a result that the electric part can be more accurately positioned and loaded.

It should be understood that the invention includes all modifications and equivalents of the described embodiments falling within the scope of the appended claims.

What is claimed:

1. Socket apparatus comprising a main socket body for removably carrying a selected electric part having a package that accommodates an electric circuit and a plurality of lead terminals that extend in a given pattern from at least one side of the package, a plurality of contact elements provided at locations in the main socket body so that each may be electrically connected with each respective lead terminal of the electric part in a 1:1 relationship, an elevator carrier vertically movable in the main socket body from a first position at which the electric part is loaded on the elevator carrier to a lower second position at which the lead terminals of the electric part connect with respective contact elements and then to a third position lower than the second position in which the elevator carrier is completely separated from the electric part.

2. Socket apparatus according to claim 1 further comprising a cover disposed on the socket body, the cover having a centrally disposed opening to allow access to the elevator carrier and being vertically movable toward and away from the socket body.

3. Socket apparatus according to claim 2 further comprising compressive laterally extending bar movably linked to the elevator carrier inside the main socket body and being movable to engage the terminal leads of an electric part disposed on the elevator carrier when the elevator carrier moves from the second to the third positions.

4. Socket apparatus according to claim 3 further including means for moving the laterally extending bar comprising a first link having first and second opposite ends, the first end of the link being pivotably connected to the cover, a second generally L-shaped link having a base with an upright portions having a distal end, the base having first and second opposite ends, the first end of the second link being pivotably connected to the socket body, the second end of the first and second links pivotably connected to one another and the distal end of the L-shaped link connected to the laterally extending bar.

5. Socket apparatus according to claim 4 in which the means for moving the elevator carrier comprises a finger portion extending from the second link and being engageable with the elevator carrier to move the elevator carrier among the first, second and third positions, the finger portion adapted to move the elevator carrier downwardly away from the electric part in the third position.

6. Socket apparatus according to claim 1 further comprising at least one leg extending downwardly from the elevator carrier, the leg having a free distal end formed with a hook, the socket body having a stop portion projecting from a sidewall, the stop portion aligned with the leg to provide stop limiting upward motion of the elevator carrier.

7. Socket apparatus according to claim 1 further comprising a package positioning means mounted on the elevator carrier for positioning of the package of the electric part in the socket apparatus.

8. Socket apparatus according to claim 1 further comprising lead terminal guide means mounted on the main body for the guidance and positioning of the terminal leads of the electric part in connection with elevator carrier's lowering of the electric part from the first position to the second position.

* * * * *